US009692355B2

(12) United States Patent
Rieh et al.

(10) Patent No.: US 9,692,355 B2
(45) Date of Patent: Jun. 27, 2017

(54) OSCILLATOR FOR HIGH-FREQUENCY SIGNAL GENERATION

(71) Applicant: KOREA UNIVERSITY RESEARCH AND BUSINESS FOUNDATION, Seoul (KR)

(72) Inventors: Jae Sung Rieh, Seoul (KR); Jong Won Yun, Seoul (KR); Nam Hyung Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 15/036,014

(22) PCT Filed: Dec. 10, 2014

(86) PCT No.: PCT/KR2014/012100
§ 371 (c)(1),
(2) Date: May 11, 2016

(87) PCT Pub. No.: WO2016/039506
PCT Pub. Date: Mar. 17, 2016

(65) Prior Publication Data
US 2016/0294324 A1    Oct. 6, 2016

(30) Foreign Application Priority Data
Sep. 11, 2014    (KR) .................. 10-2014-0120415

(51) Int. Cl.
*H03K 3/282* (2006.01)
*H03B 5/12* (2006.01)
(Continued)

(52) U.S. Cl.
CPC ............. *H03B 5/1212* (2013.01); *H03B 5/12* (2013.01); *H03B 5/1231* (2013.01); *H03B 5/18* (2013.01);
(Continued)

(58) Field of Classification Search
CPC ... H03B 5/12; H03B 5/18; H03B 1/00; H03B 2202/022; H03B 5/1231
(Continued)

(56) References Cited

U.S. PATENT DOCUMENTS

| 6,215,367 B1* | 4/2001 | Blaud | H03B 5/1231 |
| | | | 331/105 |
| 2011/0084771 A1* | 4/2011 | Nagaraj | H03B 5/1228 |
| | | | 331/117 FE |
| 2011/0102093 A1* | 5/2011 | El Rai | H03B 5/1841 |
| | | | 331/117 FE |

FOREIGN PATENT DOCUMENTS

| JP | 2006-345116 A | 12/2006 |
| KR | 10-2006-0084144 A | 7/2006 |

(Continued)

OTHER PUBLICATIONS

International Search Report issued Jun. 10, 2015 corresponding to International Application No. PCT/KR2014/012100.
(Continued)

*Primary Examiner* — Arnold Kinkead
(74) *Attorney, Agent, or Firm* — Hauptman Ham, LLP

(57) ABSTRACT

An oscillator for high-frequency signal generation is disclosed. Provided according to the present invention is an oscillator for high-frequency signal generation comprising: a first transistor comprising a first collector for receiving a power supply voltage from a load, a first base connected to a ground, and a first emitter connected to the first base; and a second transistor comprising a second collector for receiving a power supply voltage from the load, a second base
(Continued)

connected to a ground, and a second emitter connected to the second base, the oscillator having a common-base cross-coupled structure in which the first collector and the second emitter are cross-coupled and the second collector and the first emitter are cross-coupled.

3 Claims, 6 Drawing Sheets

(51) Int. Cl.
*H03B 5/18* (2006.01)
*H03B 5/20* (2006.01)

(52) U.S. Cl.
CPC ....... *H03B 5/20* (2013.01); *H03B 2200/0084* (2013.01)

(58) Field of Classification Search
USPC .................. 331/117 R, 117 FE, 167, 135
See application file for complete search history.

(56) References Cited

FOREIGN PATENT DOCUMENTS

| KR | 10-2007-0020596 A | 2/2007 |
| KR | 10-0844457 B | 7/2008 |
| KR | 10-0935969 B | 1/2010 |

OTHER PUBLICATIONS

Korean Office Action issued on Jan. 13, 2016 for the Korean Patent Application No. 10-2014-0120415.

\* cited by examiner $$H(j\omega) = \frac{V_y}{V_x} \quad |H(j\omega)|^2 \geq 1$$
$$\angle H(j\omega) = n\pi \ (n = 1, 3, 5, \dots)$$

OSCILLATOR FOR HIGH-FREQUENCY SIGNAL GENERATION

CROSS REFERENCE TO RELATED APPLICATION

This application claims the priority of Korean Patent Application No. 10-2014-0120415, filed on Sep. 11, 2014 in the KIPO (Korean Intellectual Property Office). Further, this application is the National Phase application of International Application No. PCT/KR2014/012100 filed Dec. 10, 2014, which designates the United States and was published in Korean.

TECHNICAL FIELD

The present invention relates to an oscillator for high-frequency signal generation, and more particularly, to an oscillator capable of generating a higher frequency signal than an oscillator having the existing common-emitter cross-coupled structure.

BACKGROUND ART

A high-frequency, in particular, THz frequency band can be applied in various fields including imaging, spectroscopy, biochemical detection, astronomy, wideband communication, and the like. There is a trend that a concern about the THz frequency band gradually increases and a research for implementing a THz system based on a semiconductor device having advantages including a small size, low cost, low-power driving, and the like is in progress.

As a component that plays an important role in the THz system, an oscillator is provided. This is used as a signal source of a transmitter or a local oscillator in a heterodyne structure. In particular, since there are a lot of difficulties in implementing the oscillator that operates in a high frequency band, a research for enhancing performances of the oscillator, such as an operating frequency, output power, phase noise, and the like is in active progress.

The existing oscillator having a common-emitter cross-coupled structure requires a semiconductor device and inductance and capacitance (LC tank) having a significantly small size in order to an oscillation signal at a high frequency.

However, there is a physical limit in decreasing sizes of the components and since an oscillation condition is not met, the oscillator may not oscillate.

US Patent Publication No. US 2008-0290957 discloses contents in which an oscillator having a common base structure and an oscillator having a common emitter structure are compared with each other, but does not disclose a structure in which an emitter and a collector are cross-coupled.

DISCLOSURE

Technical Problem

In order to solve the problem in the related art, an embodiment of the present invention is directed to provide an oscillator capable of a higher frequency signal than the existing oscillator having a common-emitter cross-coupled structure.

Other objects of the present invention can be derived by those skilled in the art through the following embodiments.

Technical Solution

In order to achieve the technical object, according to an aspect of the present invention, provided is an oscillator for high-frequency signal generation comprising: a first transistor comprising a first collector for receiving a power supply voltage from a load, a first base connected to a ground, and a first emitter connected to the first base; and a second transistor comprising a second collector for receiving a power supply voltage from the load, a second base connected to a ground, and a second emitter connected to the second base, the oscillator having a common-base cross-coupled structure in which the first collector and the second emitter are cross-coupled and the second collector and the first emitter are cross-coupled.

The oscillator may further include a feedback impedance element connected each between the first collector and the second emitter and between the second collector and the first emitter.

The oscillator may further include a base-emitter impedance element connected between the first base and the first emitter and between the second base and the second emitter.

The oscillator may further include: a first capacitor connected between the first collector and the first base; and a second capacitor connected between the second collector and the second base.

According to another aspect of the present invention, provided is an oscillator for high-frequency signal generation comprising: a first transistor including a first drain receiving a power supply voltage from a load, a first gate connected to a ground, and a first source connected with the first gate; and a second transistor including a second drain receiving the power supply voltage from the load, a second gate connected to the ground, and a second source connected with the second gate, the oscillator having a common-gate cross-coupled structure in which the first drain and the second source are cross-coupled and the second drain and the first source are cross-coupled.

Advantageous Effects

According to the present invention, since an oscillator including a common base structure is used, an oscillation signal of a higher frequency than the existing oscillator can be generated.

BEST MODE FOR THE INVENTION

Figure 1:
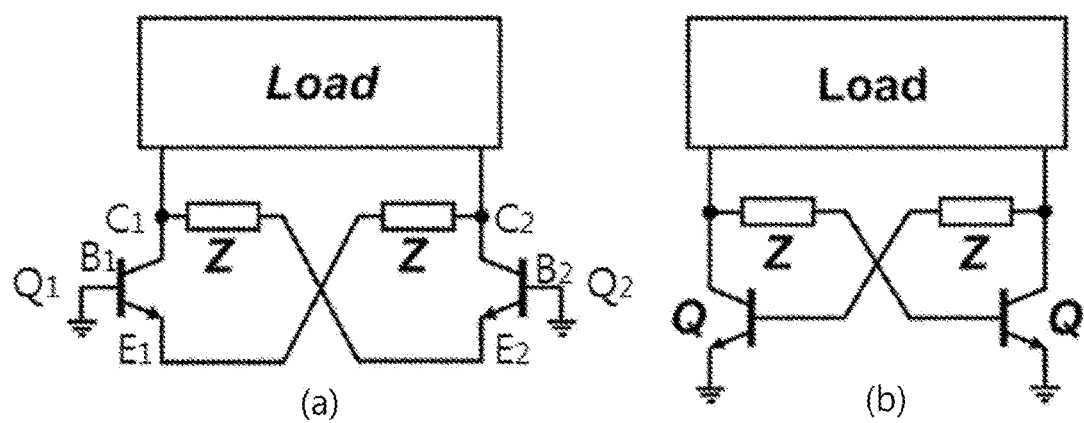
FIG. 1(a) illustrates a common-base cross-coupled differential oscillator according to an embodiment of the present invention and FIG. 1(b) is a diagram schematically illustrating a common-emitter cross-coupled differential oscillator.

The present invention may have various modifications and various embodiments and specific embodiments will be illustrated in the drawings and described in detail in the detailed description. However, this does not limit the present invention to specific embodiments, and it should be understood that the present invention covers all the modifications, equivalents and replacements included within the idea and technical scope of the present invention. In describing each drawing, like reference numerals refer to like elements.

Hereafter, embodiments of the present invention will be described in detail with reference to the accompanying drawings.

For easy description, hereinafter, a common-base cross-coupled differential oscillator according to an embodiment of the present invention and the existing common-emitter cross-coupled differential oscillator will be compared with each other and described.

FIG. 1(a) illustrates a common-base cross-coupled differential oscillator according to an embodiment of the present invention and FIG. 1(b) is a diagram schematically illustrating a common-emitter cross-coupled differential oscillator.

Referring to FIG. 1(a), a base B is connected to a ground which is a common terminal and an emitter E and a collector C of each transistor are cross-coupled.

In more detail, the common-base cross-coupled differential oscillator according to the embodiment may include a first transistor $Q_1$ including a first collector $C_1$ receiving a power supply voltage from a load, a first base $B_1$ connected to the ground, and a first emitter $E_1$ connected with the first base $B_1$ and a second transistor $Q_2$ including a second collector $C_2$ receiving the power supply voltage from the load, a second base $B_2$ connected with the ground, and a second emitter $E_2$ connected with the second base $B_2$.

Herein, the first collector $C_1$ and the second emitter $E_2$ are cross-coupled and the second collector $C_2$ and the first emitter $E_1$ are cross-coupled.

Meanwhile, referring to FIG. 1(b), the emitter E is connected to the ground and the bases B and the collectors C are cross-coupled.

An inductor and a capacitor having impedance Z are disposed on a path where both the common-base cross-coupled differential oscillator and the common-emitter cross-coupled differential oscillator are cross-coupled.

In particular, in the common-base cross-coupled differential oscillator according to the embodiment, an impedance element $Z_1$ is provided each between the first collector $C_1$ and the second emitter $E_2$ and between the second collector $C_2$ and the first emitter $E_1$.

A load may be regarded as a component including a parasitic component of the transistor as well as a load of a collector terminal. An oscillation frequency is determined by all of the components.

Figure 2:
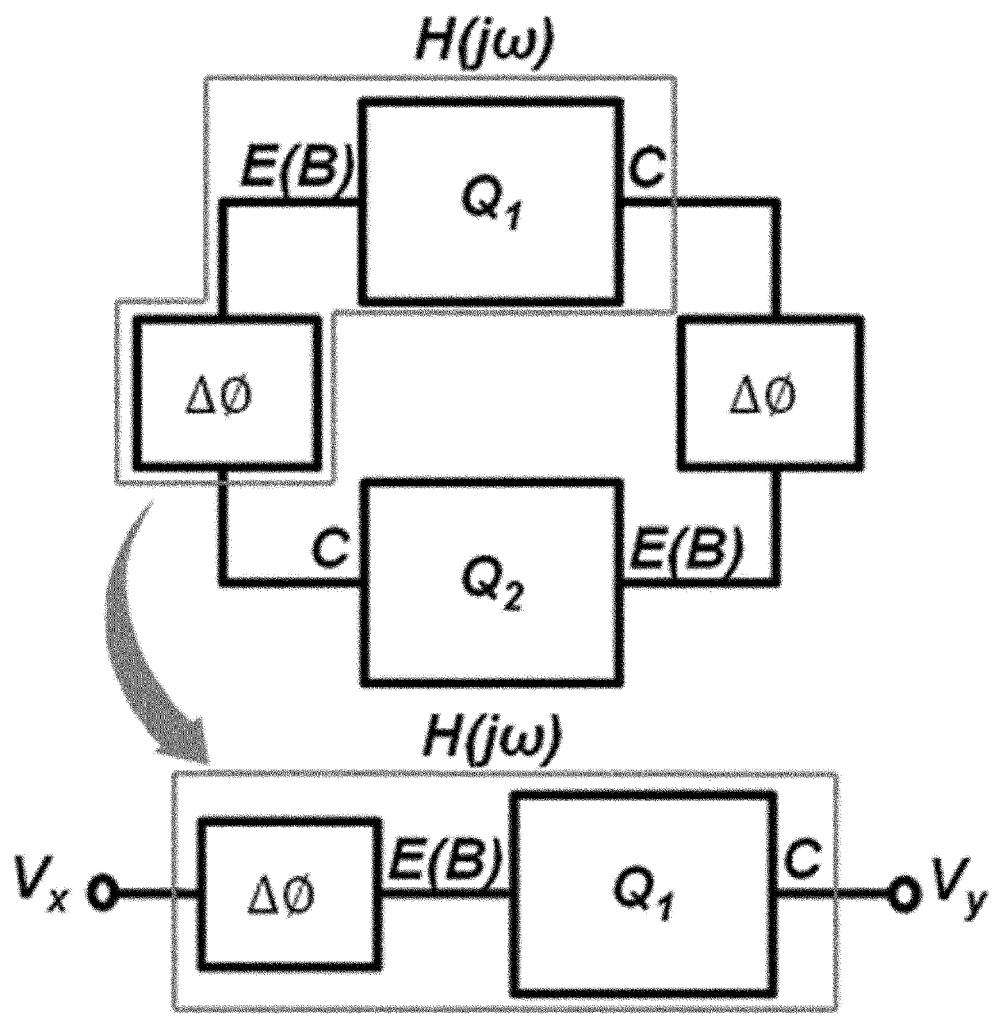
FIG. 2 is a conceptual view illustrating operating principles of the common-base cross-coupled differential oscillator according to the embodiment of the present invention and the existing common-emitter cross-coupled differential oscillator.

FIG. 2 is a conceptual view illustrating operating principles of the common-base cross-coupled differential oscillator and the common-emitter cross-coupled differential oscillator.

A principle in which a circuit oscillates may be described with Barkhausen criteria.

Fundamentally, in a form in which two common-base (alternatively, emitter) amplifiers are cross-coupled to each other, when inputs (the emitter or base) to outputs (the collector) of the respective amplifiers have a phase difference of 180 degrees (nπ, n=1, 3, 5, . . . ) at a specific frequency and a loop gain is 1 or more, oscillation occurs at the corresponding frequency.

Herein, the amplifier is constituted by Q which is the transistor and $\Delta_\phi$ (corresponding to a transmission line and the load of the aforementioned impedance Z) which givens an additional phase difference.

When a specific noise signal moves at one point of a loop to be returned through cross-coupled feedbacks, in the case where the respective amplifiers acquire the gains and the same phase, the signal is gradually amplified, and as a result, the oscillation occurs. For the same phase, the respective amplifiers may have a phase difference of 180 degrees or 0 (360) degree(s), but an output terminal of the oscillator needs to phase the phase difference of 180 degrees or a phase difference of odd multiples to obtain a differential output.

Figure 3:
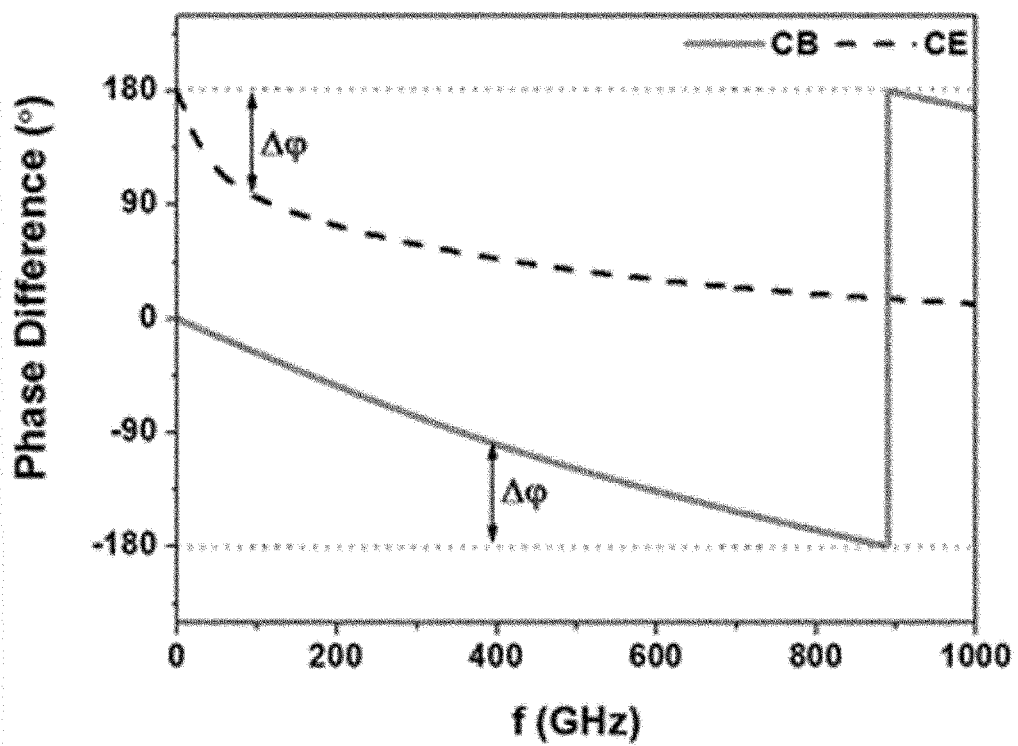
FIG. 3 is a diagram illustrating a result of simulating a phase difference between an input and an output of a transistor (in the transistor, 5 µm is used as an InP HBT emitter length) in one common-base cross-coupled differential oscillator and one common-emitter cross-coupled differential oscillator with a function of a frequency.

FIG. 3 illustrates a result of simulating a phase difference between an input and an output of a transistor (in the transistor, 5 µm is used as an InP HBT emitter length) in one common-base cross-coupled differential oscillator and one common-emitter cross-coupled differential oscillator with a function of a frequency.

That is, the result is acquired by disregarding the component corresponding to $\Delta_\phi$.

In the case of the common-base cross-coupled differential oscillator, at a DC level at which the frequency is 0, the phase difference of the transistor starts from 0 degree and thereafter, increases in a (−) direction according to the frequency and in the case of the common-emitter cross-coupled differential oscillator, the phase difference starts from 180 degrees and thereafter, decreases to 0 degree according to the frequency.

A point where the phase difference is 180 degrees is the DC level in the case of a common emitter and appears approximately at 900 GHz in the case of a common base.

That is, when there is no influence of $\Delta_\phi$, the oscillator having the common emitter structure needs to oscillate at DC and the oscillator having the common base structure needs to oscillate at 900 GHz.

However, the oscillation may not occur at the DC and since the gain of the transistor is not 1 or more at 900 GHz, the oscillation condition is not met in both cases. Herein, when the influence of $\Delta_\phi$ is considered, in the case where the phase difference condition of 180 degrees is met due to an additional phase difference of $\Delta_\phi$ at a specific frequency, the oscillation occurs at the corresponding frequency.

Since it is not easy to meet the condition around the frequency at which the phase difference of the transistor itself is 180 degrees, it may be regarded that the oscillator having the common-base structure oscillates at a higher frequency than the oscillator having the common-emitter structure on the assumption that the $\Delta_\phi$ is similar.

FIG. 4(a) is a diagram illustrating a detailed configuration of a common-base cross-coupled differential oscillator according to an embodiment of the present invention and FIG. 4(b) is a diagram illustrating a detailed configuration of a common-emitter cross-coupled differential oscillator.

Referring to FIG. 4(a), in the common-base cross-coupled differential oscillator, an impedance element $Z_1$ is provided between the first collector $C_1$ and the second emitter $E_2$ and between the second collector $C_2$ and the first emitter $E_1$, that is, on the path where the both the collectors and the emitters are cross-coupled.

Further, a base-emitter impedance $Z_2$ is provided between the first collector $C_1$ and the first emitter $E_1$ and between the second base $B_2$ and the second emitter $E_2$.

As illustrated in FIG. 4(c), in the feedback impedance, an inductance $L_F$ and a capacitor $C_F$ are connected in series and in the base-emitter impedance, a resistor $r_{BE}$ and a capacitor $C_{BE}$ are connected in parallel.

Furthermore, a capacitor $C_{CB}$ is provided between the first collector $C_1$ and the first base $B_1$ and between the second collector $C_2$ and the second base $B_2$.

Figure 4:
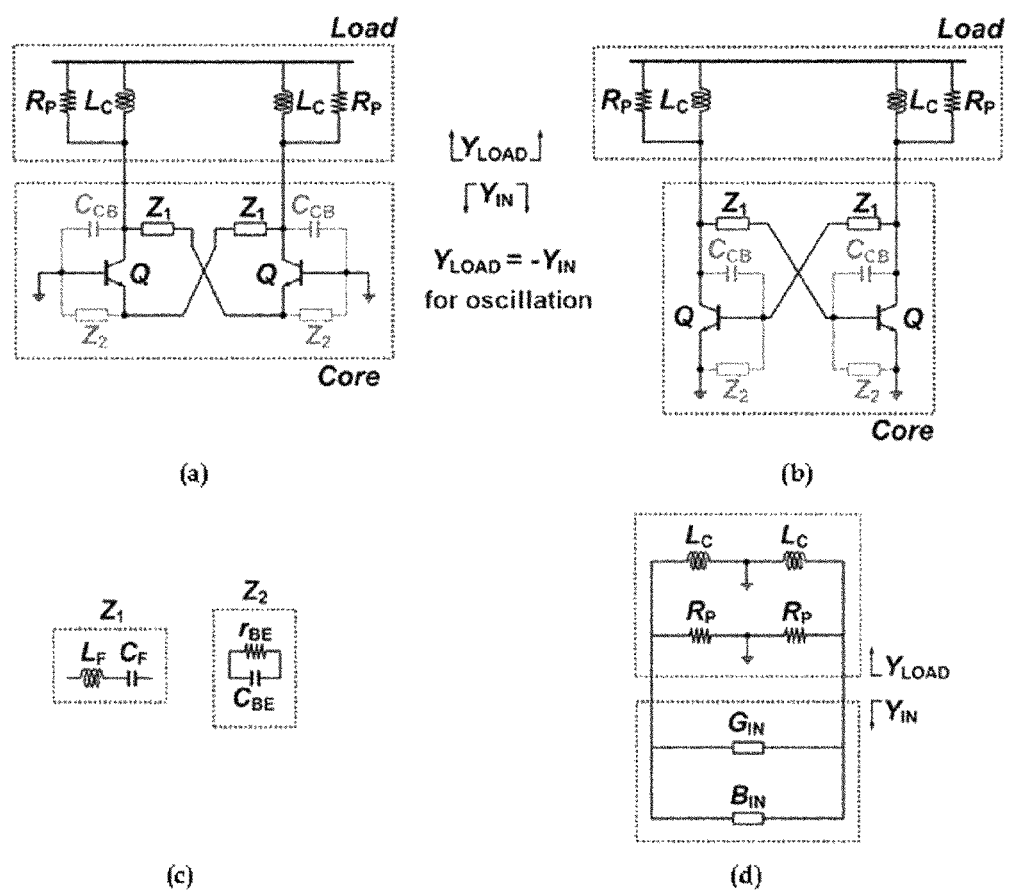
FIG. 4 is a diagram illustrating detailed configurations of the common-base cross-coupled differential oscillator according to the embodiment of the present invention and the existing common-emitter cross-coupled differential oscillator.

FIG. 4(d) is an equivalent circuit of the common-base and common-emitter cross-coupled differential oscillators In FIG. 4, as the load, an inductor LC and a parallel resistor $R_P$ thereof are illustrated, and $C_{CB}$ and $Z_2$ (a parallel combination of $C_{BE}$ and $r_{BE}$) which are parasitic components of the transistor are illustrated in detail in the core including the transistor.

The operating principle of the oscillator may be described with negative conductance −Gm in addition to Barkhausen criteria. Fundamentally, oscillation occurs when admittance of the load is the same as a negative of input admittance of the core.

Each admittance may be divided into a real number part and an imaginary number part and the oscillation condition is satisfied when a real number part of the core offsets a real part of the load and a frequency at which the imaginary number part of the core and the imaginary number part of the load are added up to be 0 becomes the oscillation frequency.

Accordingly, $G_{IN}$ (conductance) which is the real number part of the core needs to have a (−) value, an absolute value needs to be equal to or larger than ½RP which is the real number part of the load, and BIN which is the imaginary number part of the core needs to be the same as a negative of 1/j2ωLC which is the imaginary number part of the load.

Figure 5:
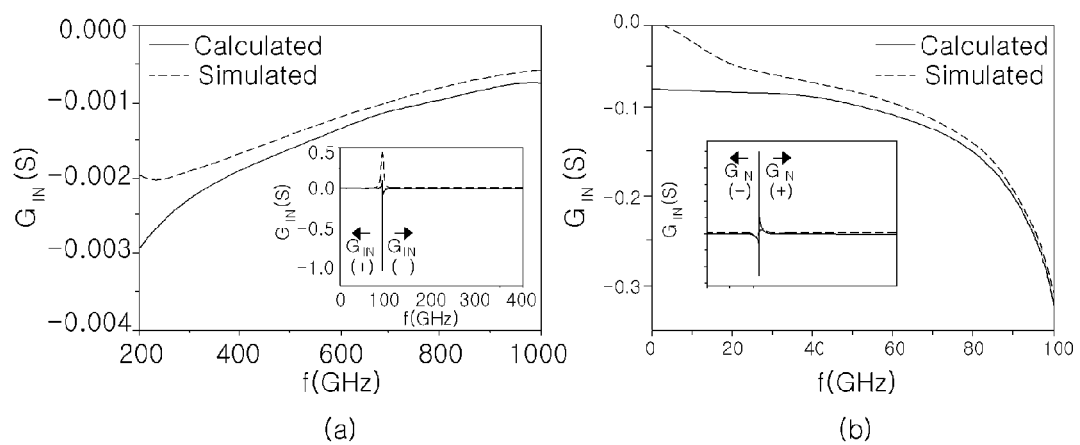
FIG. 5 is a diagram illustrating conductance $G_{IN}$ of a core, which is acquired through 1-port analysis in FIG. 4 as the function of the frequency.

FIG. 5 is a diagram illustrating conductance $G_{IN}$ of a core, which is acquired through 1-port analysis in FIG. 4 as the function of the frequency.

FIG. 5(a) is a diagram regarding the oscillator having the common-base cross-coupled structure and FIG. 5(b) is a diagram regarding the oscillator having the common-emitter cross-coupled differential oscillator.

In the respective cases, GIN is divided into ranges of (+) and (−) values based on a resonance frequency as a resonance phenomenon appears around 100 GHz.

$G_{IN}$ calculated for verifying accuracy of the analysis is compared with a simulation result and shows a similar trend.

First, in the case of the common base, $G_{IN}$ shows the (−) value above the resonance frequency and in the case of the common emitter structure, GIN shows the (−) value below the resonance frequency. That is, from a frequency range of GIN in which the oscillation condition is met only with the (−) value, it can be seen that the common base structure is ever higher than the common emitter structure.

Figure 6:
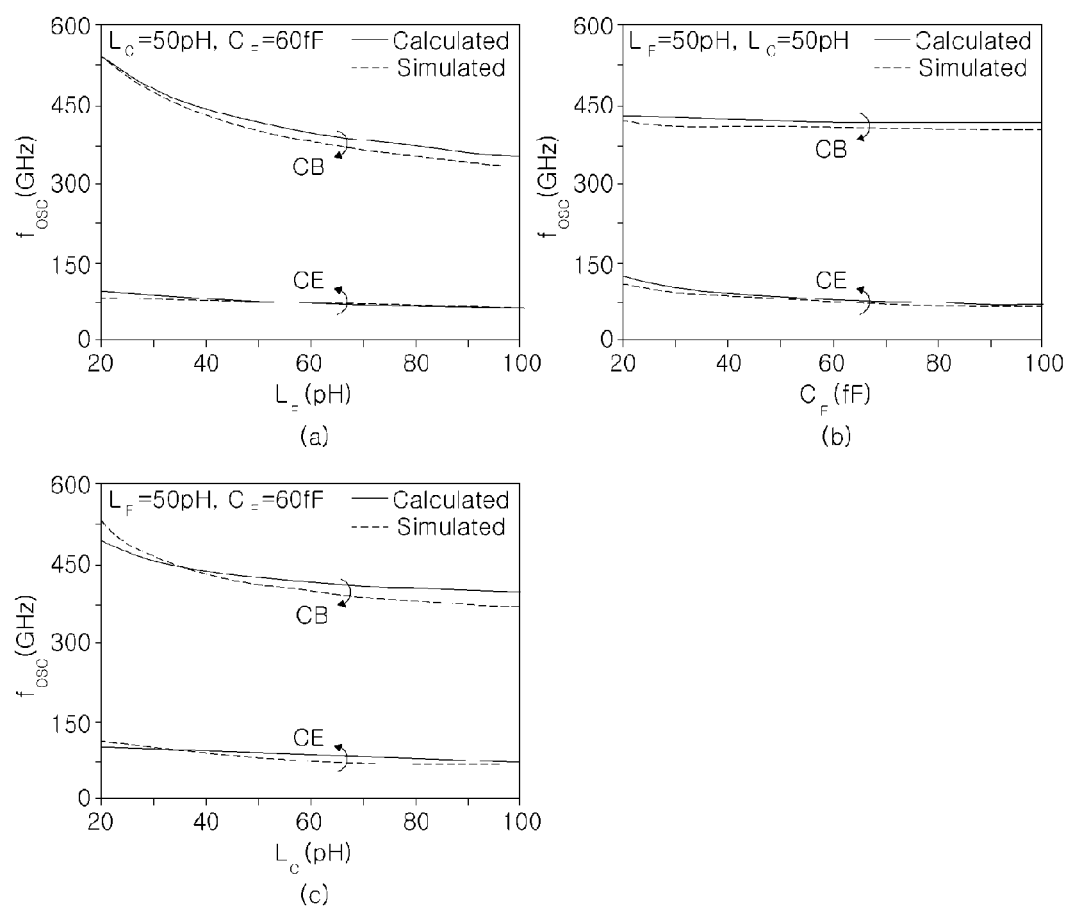
FIG. 6 is a diagram illustrating an oscillation frequency acquired through analysis as functions of (a) $L_F$, (b) $C_F$, and (c) $L_C$.

FIG. 6 is a diagram illustrating an oscillation frequency acquired through analysis as functions of (a) $L_F$, (b) $C_F$, and (c) $L_C$.

Similarly, the calculated result and the simulated result are compared with each other and the accuracy of the analysis is guaranteed by showing a comparatively small error. As verified in the drawings, the common-base cross-coupled differential oscillator shows an even higher oscillation frequency than the common-emitter cross-coupled differential oscillator.

Hereinabove, the structure in which in the transistor constituted by the collector, the base, and the emitter, collectors and emitters of different transistors are cross-coupled is described, but the present invention is not limited thereto and even in a transistor having a MOSFET structure including a drain, a gate, and a source, a case in which the gate is connected to the ground and the drains and the sources of different transistors are cross-coupled may also be included in the scope of the present invention.

The embodiments of the present invention are illustrative only, and various modifications, changes, substitutions, and additions may be made without departing from the technical spirit and scope of the appended claims by those skilled in the art, and it will be appreciated that the modifications and changes are included in the present invention.

The invention claimed is:

1. A common-base cross-coupled oscillator for high-frequency signal generation, the oscillator comprising:
   a first transistor including a first collector receiving a power supply voltage from a load, a first base connected to a ground, and a first emitter connected with the first base;
   a second transistor including a second collector receiving the power supply voltage from the load, a second base connected to the ground, and a second emitter connected with the second base;
   a first capacitor connected between the first collector and the first base;
   a second capacitor connected between the second collector and the second base; and
   the oscillator having a common-base cross-coupled structure in which the first collector and the second emitter are cross-coupled and the second collector and the first emitter are cross-coupled.

2. The common-base cross-coupled oscillator of claim 1, further comprising:
   a feedback impedance element connected each between the first collector and the second emitter and between the second collector and the first emitter.

3. The common-base cross-coupled oscillator of claim 1, further comprising:
   a base-emitter impedance element connected between the first base and the first emitter and between the second base and the second emitter.

* * * * *